PRINTED CIRCUIT STRUCTURE AND METHOD OF MAKING THE SAME

Filed Nov. 13, 1962 2 Sheets-Sheet 1

INVENTOR.
Paul L. Anderson
John A. Zagusta
Robert R. Churchill
ATTORNEY

PRINTED CIRCUIT STRUCTURE AND METHOD OF MAKING THE SAME

Filed Nov. 13, 1962 2 Sheets-Sheet 2

INVENTOR.
Paul L. Anderson
John A. Zagusta
Robert R. Churchill
ATTORNEY

United States Patent Office 3,340,606
Patented Sept. 12, 1967

3,340,606
PRINTED CIRCUIT STRUCTURE AND METHOD OF MAKING THE SAME
Paul L. Anderson, Vernon, Conn., and John A. Zagusta, Jackson Heights, N.Y., assignors to Rogers Corporation, Rogers, Conn., a corporation of Massachusetts
Filed Nov. 13, 1962, Ser. No. 236,920
3 Claims. (Cl. 29—625)

This invention relates to a printed circuit structure and to method of making the same.

The invention has for an object to provide a novel and improved printed circuit structure embodying increased electrical properties, heat and chemical resistance and wearing qualities.

Another object of the invention is to provide a novel and improved method of producing a printed circuit structure of the character described.

With these general objects in view and such others as may hereinafter appear, the present invention consists in the printed circuit structure and in the method of making the same hereinafter described and particularly defined in the claims at the end of this specification.

In the drawings illustrating the preferred embodiment of the invention:

Figure 1:
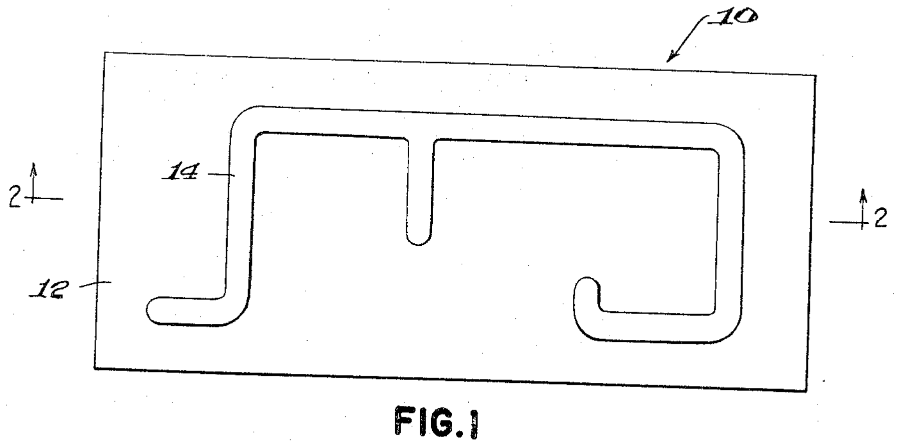
FIG. 1 is a plan view of the present printed circuit structure.

In general the present invention contemplates a novel and improved printed circuit structure and method of making the same wherein the printed circuit structure embodies a fabric circuit pattern carrying sheet which is supported on a relatively tough fabric backing sheet. The metallic foil circuit pattern is delineated upon the pattern carrying sheet. Preferably, the circuit pattern carrying sheet comprises a non-stretchable woven or unwoven fabric, preferably a fiber glass cloth sheet or a sheet comprising a combination of glass fibers and Dacron fibers, either woven or unwoven, which is saturated with a resin having good electrical characteristics, such as a melamine resin. The tough flexible backing sheet preferably comprises a synthetic plastic film, such as Mylar, or a fabric based on high strength synthetic fibers, thereby providing a flexible relatively thin backing sheet having high dielectric properties for supporting the glass cloth pattern carrying sheet and enabling the metal foil circuit to be stamped directly onto the glass cloth sheet.

Prior to the present invention, as far as is known, it was not possible to stamp or cut a metal foil circuit pattern on a fiber glass sheet. The non-stretchable characteristics of the glass cloth render the same very susceptible to being cut by the stamping tool. Thus, prior to the present invention when foil was cut against glass cloth the utility of the glass cloth was destroyed.

In accordance with the preferred method of producing the present printed circuit structure the fiber glass cloth sheet is impregnated with a commercially available phenolic, melamine, silicon or other good electrical grade resin. The synthetic fabric backing sheet is also impregnated with a similar resin by any preferred method, such as dipping or otherwise coating the same on both sides. The glass cloth sheet is then placed on the backing sheet, which is in turn supported on a resilient base, such as cork or rubber, the resilient base being supported on a nonresilient die base. A thin copper foil is superimposed on the surface of the glass cloth, and a male stamping die having the desired circuit engraved thereon is used to die stamp the circuit from the metal foil sheet. The combination of backing sheet and resilient base permits the pattern to be cut against the glass cloth without destroying the utility of the glass cloth. Thereafter, the unwanted foil may be removed, and the assembly may be subjected to heat and pressure in a suitable mold and the foil, glass cloth and backing securely bonded together. The molded assembly may then be mounted on a relatively rigid insulating backing and used, for example, in a radio or television set.

In accordance with another method of producing the present printed circuit structure the glass cloth sheet may be coated on one surface with an adhesive and adhesively secured to the backing sheet, and the metal foil may be also coated with an adhesive and adhesively secured to the surface of the glass cloth sheet. The pattern may then be cut and finished in the manner described in connection with the preferred method. It will be understood that the assembly of foil, glass cloth and backing sheet may be used as a relatively flexible assembly or may be mounted on a rigid insulating base if desired.

Referring now to the drawings, 10 represents a printed circuit assembly produced in accordance with the present invention wherein 12 comprises a relatively thin fiber glass sheet which may be either woven or unwoven having a conductive metal foil circuit pattern 14 secured to one face thereof. The glass cloth sheet 12 is preferably dipped in or coated with a phenolic resin 18 on both sides and is placed on a backing or supporting sheet 16. The backing sheet 16 preferably comprises a synthetic film, such as Mylar, or a fabric based on high strength synthetic fibers, which is dipped in or coated with a phenolic 18 or other good commercial electrical grade resin, thus providing a tough flexible support for the pattern carrying glass cloth sheet 12. The backing sheet 16 provides a relatively tough yieldable support such that the glass cloth sheet 12 can withstand the die stamping operation, the sheet 16 yielding relative to the metal foil and glass cloth sheet during the stamping operation while providing sufficient support for the glass cloth sheet 12 to enable the conductive foil to be cut.

Figure 2:
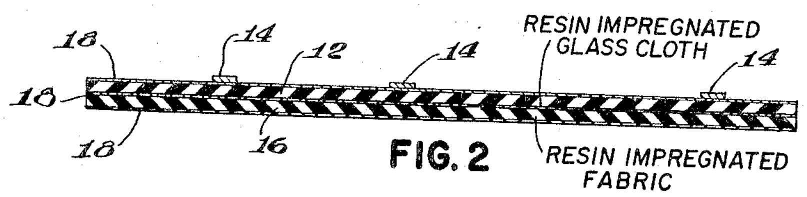
FIG. 2 is a cross section taken on the line 2—2 of FIG 1.
Figure 3:
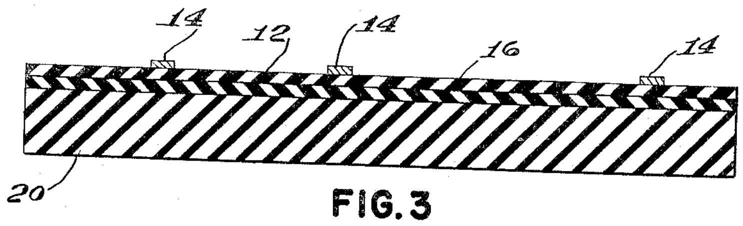
FIG. 3 is a side elevation of the printed circuit assembly of FIG. 2 mounted on an insulating base sheet.

As shown in FIG. 3, the assembly of FIG. 2, produced in accordance with one method of producing the present circuit structure, may be bonded to a rigid moldable insulating base member 20 embodying a curable resin, and the entire assembly cured by heat and pressure as disclosed in United States Patent No. 2,972,003, issued Feb. 14, 1961.

Figures 5, 6:
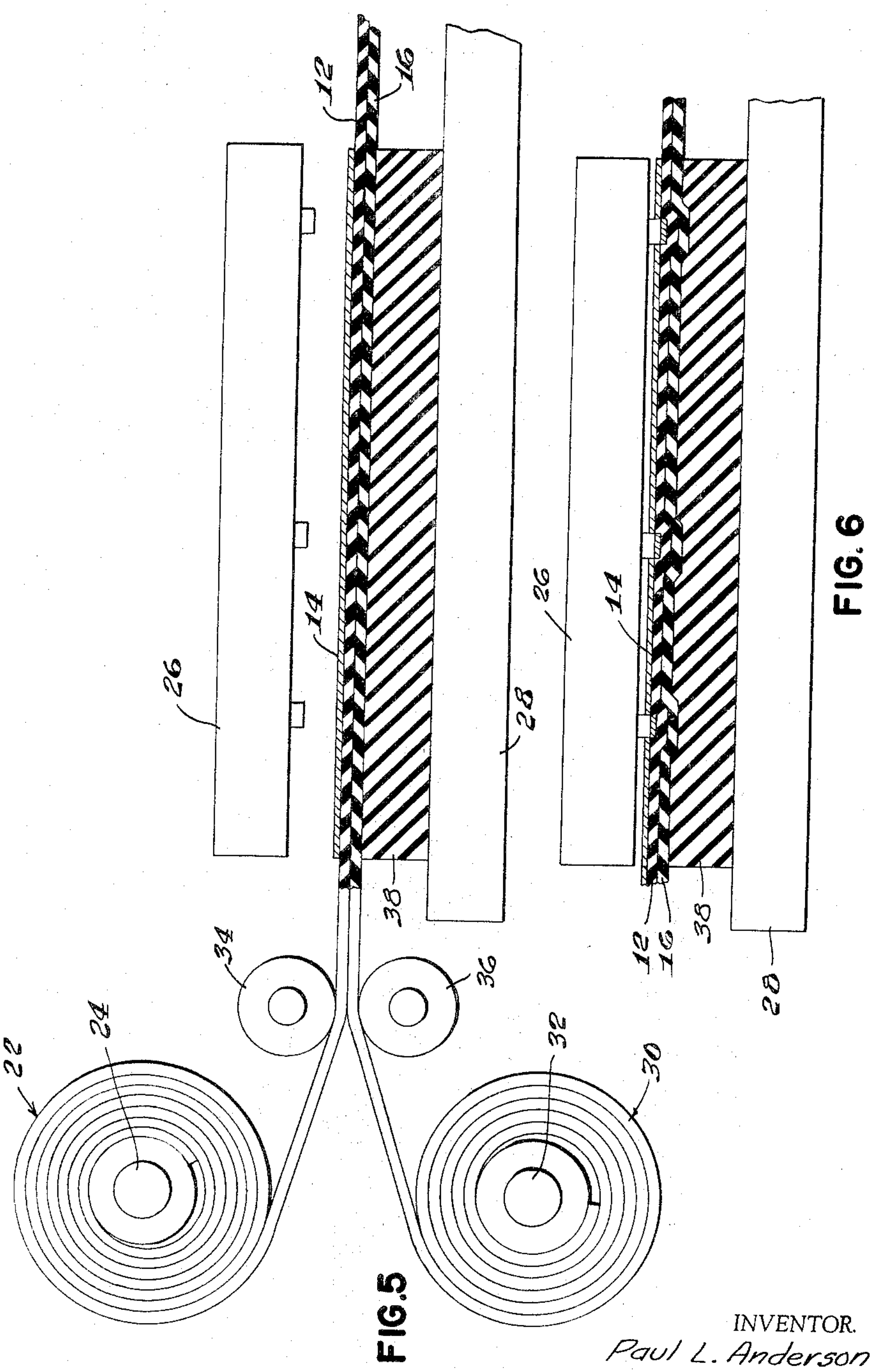
FIGS. 5 and 6 are views in side elevation of apparatus for producing the present printed circuit structure.

As illustrated in FIGS. 5 and 6, illustrating one method of producing the present printed circuit structure, a roll 22 of resin impregnated glass cloth is mounted on a shaft 24 and, as shown, is arranged to be fed in any suitable manner, such as by feed rolls, not shown, between the male stamping die 26 and the die base 28. A similar roll 30 of film or synthetic resin impregnated fabric is mounted on a shaft 32 and is also fed between the die members 26, 28. As shown, the glass cloth and backing sheet are fed or drawn between pressure rolls 34, 36 and thereby pressed together with the glass cloth sheet overlying the backing sheet and then the superimposed sheets are passed between the open sections of the die members.

In order to facilitate the die stamping operation a resilient base member 38 is mounted on the upper surface of the die base, the superimposed glass cloth and backing sheet assembly being supported between the die members 26, 28 on the upper surface of the resilient member 38 as shown. A sheet of relatively thin conductive metal foil is placed on the upper surface of the glass cloth sheet and the die member 26 urged by suitable means, not shown, downwardly to cut the foil 14 against the glass cloth and backing sheet. In accordance with the invention a roll of foil may be supported in a manner similar to the glass cloth and fabric materials and drawn between the open die members to overlie the glass cloth. As best shown in FIG. 6, during the die stamping operation the glass cloth and backing sheets yield downwardly into the resilient base member 38. The resilient base member may comprise rubber or like material capable of yielding to permit the assembly of glass and fabric or film to be depressed and yet sufficiently rigid to permit the foil to be effectively cut.

Figure 4:
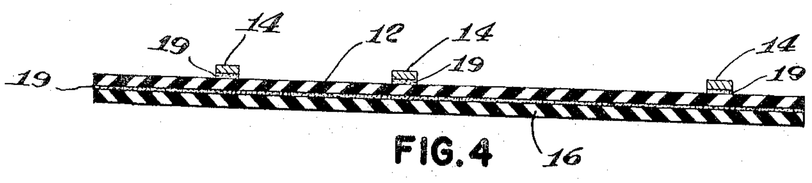
FIG. 4 is a side view illustrating a modified form of printed circuit structure.

In one form of the present invention illustrated in FIG. 4 the conductive metal foil 14 is coated on one face with an adhesive 19 and adhesively secured to the upper face of the glass cloth 12, and the bottom surface of the glass cloth and/or the upper surface of the backing sheet 16 are also coated with an adhesive 19 so that the glass cloth and backing are secured together prior to the die stamping operation.

In practice, after the conductive metal circuit pattern has been stamped onto the glass cloth sheet 12, the unwanted foil may be removed and the assembly of foil, glass cloth and backing sheet may be removed from the resilient base 38, cut to any desired shape and adhesively secured to a relatively rigid insulating base sheet of the character hereintofore described.

Numerous advantages are derived from the present method of producing a printed circuit in the manner above described, which method includes the stamping of a printed circuit pattern onto a fiber glass cloth sheet. Among the advantages provided by the present method is the increased resistance to heat, arcing and increased resistance to the action of chemicals. The increased heat resistance enables the present circuit structure to withstand the temperatures it must be subjected to during soldering operations. The present method further provides a printed circuit structure having highly efficient dielectric properties.

Having thus described the invention, what is claimed is:

1. A method of making a printed circuit structure which comprises the steps of superimposing a non-stretchable fibrous sheet on a tough synthetic stretchable backing sheet coated with a curable resin, placing the assembly on a resilient base member supported on a die base, placing a relatively thin conductive metal foil on the fibrous sheet, and die stamping said foil sheet to cut and produce a circuit pattern without damage to said fibrous sheet by virtue of the stretchability of said backing sheet and the resiliency of said base member and to adhere the glass fabric and backing sheet together and the circuit pattern to the glass fabric sheet to provide a flexible heat-resistant assembly.

2. A method of making a printed circuit structure which comprises the steps of impregnating a non-stretchable cloth sheet of woven glass fibers and a stretchable backing sheet of synthetic fabric with a resin having good electrical characteristics, placing the glass cloth sheet on the synthetic fabric sheet, superimposing a thin conductive metal foil sheet on the glass cloth sheet, supporting the foil, glass cloth and synthetic fabric assembly on a resilient base member, and die stamping the metal foil to cut and produce a circuit pattern without injury to said glass cloth by virtue of the stretchability of said backing sheet and the resiliency of said base member, removing the unwanted foil, securing the assembly to a rigid insulating base member, and subjecting the same to heat and pressure to provide an efficient heat-resistant printed circuit structure.

3. A method of making a printed circuit structure which comprises the steps of impregnating a non-stretchable glass fabric sheet and a stretchable synthetic backing sheet with a dielectric resin, superimposing the glass fabric sheet on the backing sheet, placing the assembly on a resilient base member supported on a die base, placing a relatively thin conductive metal foil on the glass fabric sheet, adhesively securing the metal foil and backing to the glass fabric sheet and die stamping said foil sheet to cut and produce a circuit pattern without injury to said glass fabric sheet by virtue of the stretchable characteristics of the backing sheet, and the resiliency of said base member.

References Cited

UNITED STATES PATENTS

| | | | |
|---|---|---|---|
| 2,680,699 | 6/1954 | Rubin. | |
| 2,849,298 | 8/1958 | Weberig | 156—8 |
| 2,955,974 | 10/1960 | Allen et al. | |

FOREIGN PATENTS

| | | |
|---|---|---|
| 793,911 | 4/1958 | Great Britain. |

JOHN F. CAMPBELL, *Primary Examiner.*

DANELL L. CLAY, JOHN P. WILDMAN, *Examiners.*

R. W. CHURCH, *Assistant Examiner.*